(12) United States Patent
Huang et al.

(10) Patent No.: US 9,679,854 B2
(45) Date of Patent: Jun. 13, 2017

(54) RECONFIGURABLE REPEATER SYSTEM

(71) Applicant: Intel Corporation, Santa Clara, CA (US)

(72) Inventors: Shaowu Huang, Seattle, WA (US); Beom-Taek Lee, Mountain View, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/619,052

(22) Filed: Feb. 10, 2015

(65) Prior Publication Data

US 2016/0233922 A1    Aug. 11, 2016

(51) Int. Cl.
*H01L 23/538* (2006.01)
*H04B 3/36* (2006.01)
(Continued)

(52) U.S. Cl.
CPC ...... *H01L 23/5382* (2013.01); *H01L 23/5389* (2013.01); *H04B 3/36* (2013.01);
(Continued)

(58) Field of Classification Search
CPC . H01L 23/5382; H01L 23/5389; H04L 25/20; G06F 13/4247; G06F 1/185; G11C 7/1003; H01R 12/735; H05K 1/029; H05K 1/14; H05K 1/144; H05K 7/1459; H04B 3/36; H04B 10/291
See application file for complete search history.

(56) References Cited

U.S. PATENT DOCUMENTS 5,090,117 A * 2/1992 Dickie ............. H01R 13/65802
264/272.14
5,574,814 A * 11/1996 Noddings ............ G02B 6/4249
385/89
(Continued)

OTHER PUBLICATIONS

SAMTEC, Connectors—High Speed Board to Board, https://www.samtec.com/connectors/high-speed-board-to-board.aspx, 2014, 6 pages.
(Continued)

*Primary Examiner* — Michelle M Koeth
(74) *Attorney, Agent, or Firm* — Grossman, Tucker, Perreault & Pfleger, PLLC

(57) ABSTRACT

The present disclosure is directed to a reconfigurable repeater system. A system may comprise a PCB to which devices are coupled. At least one communication channel may convey communications signals between the devices. At least one receptacle may also be coupled to the PCB and may intersect the at least one communication channel so as to separate the at least one communication channel into sections. Inserting at least one extender module into the at least one receptacle may couple the at least one extender module to the sections of the communication module. The at least one extender module may include at least one conductor to convey communication signals between the sections of the at least one communication channel. Another configuration of the at least one extender module may include a repeater to receive, amplify and transmit communication signals between the sections of the at least one communication channel.

15 Claims, 7 Drawing Sheets

(51) Int. Cl.
  *H04L 25/20* (2006.01)
  *G06F 1/18* (2006.01)
  *H05K 1/02* (2006.01)
  *H05K 1/14* (2006.01)
(52) U.S. Cl.
  CPC .............. *H04L 25/20* (2013.01); *G06F 1/185* (2013.01); *H05K 1/029* (2013.01); *H05K 1/14* (2013.01); *H05K 1/144* (2013.01)

(56) References Cited

U.S. PATENT DOCUMENTS

| | | | |
|---|---|---|---|
| 2002/0126371 A1* | 9/2002 | Shigehara | G02B 6/02138 359/337.1 |
| 2007/0165710 A1* | 7/2007 | Alameh | H04L 25/0286 375/220 |
| 2011/0149499 A1* | 6/2011 | Bandholz | G06F 1/185 361/679.31 |
| 2011/0316505 A1* | 12/2011 | Shrivastava | H03K 19/01852 323/282 |
| 2013/0107443 A1* | 5/2013 | Kim | G11C 5/04 361/679.32 |
| 2013/0225067 A1* | 8/2013 | Card | H04L 25/20 455/7 |
| 2015/0118913 A1* | 4/2015 | Knowlden | H01R 9/16 439/660 |

OTHER PUBLICATIONS

SAMTEC, Connectors—Edge Card/ Micro Backplane, https://www.samtec.com/connectors/edge-card-micro-backplane.aspx, 2014, 4 pages.

* cited by examiner

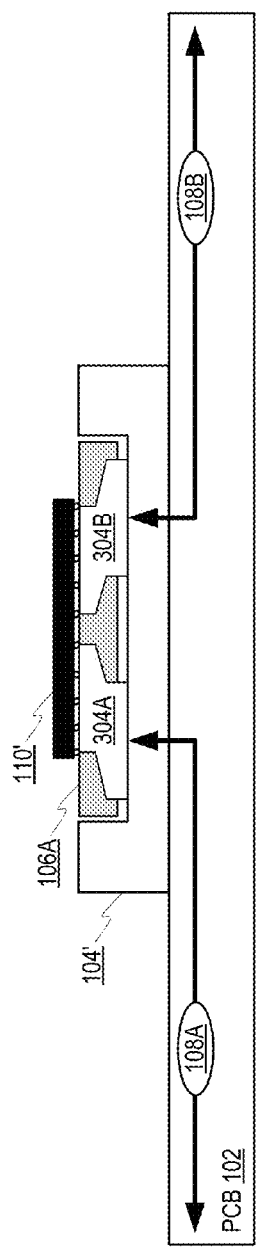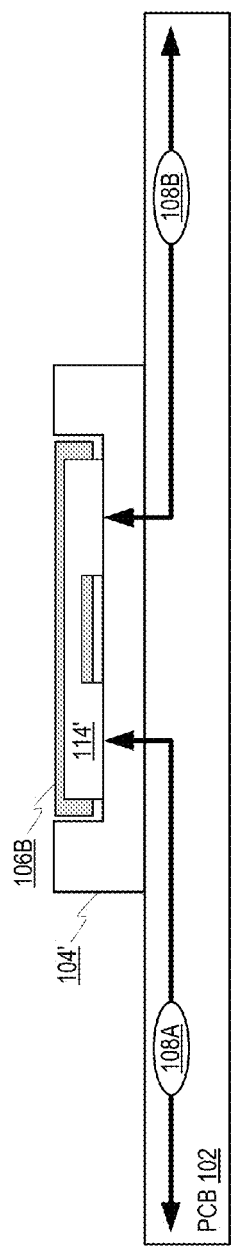

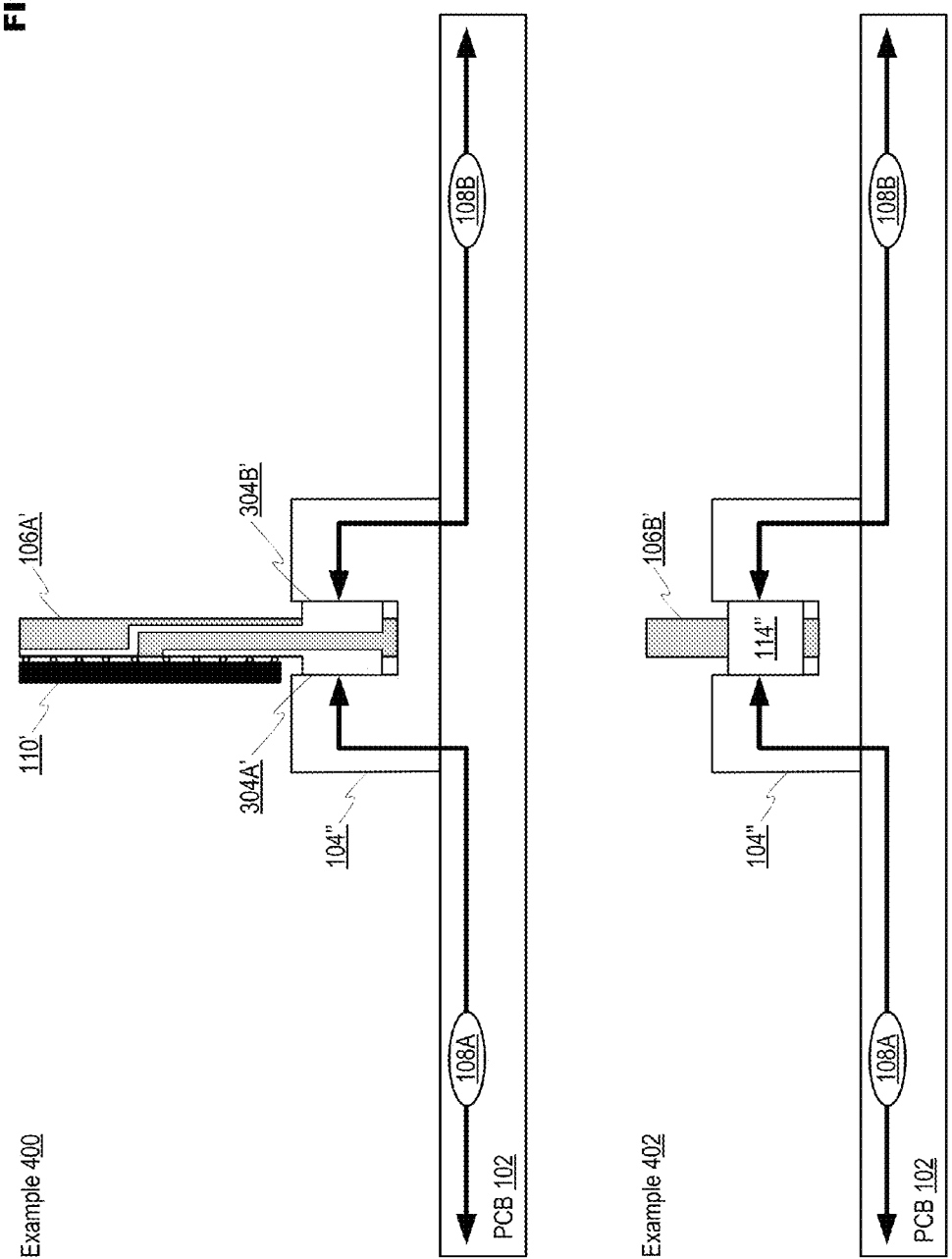

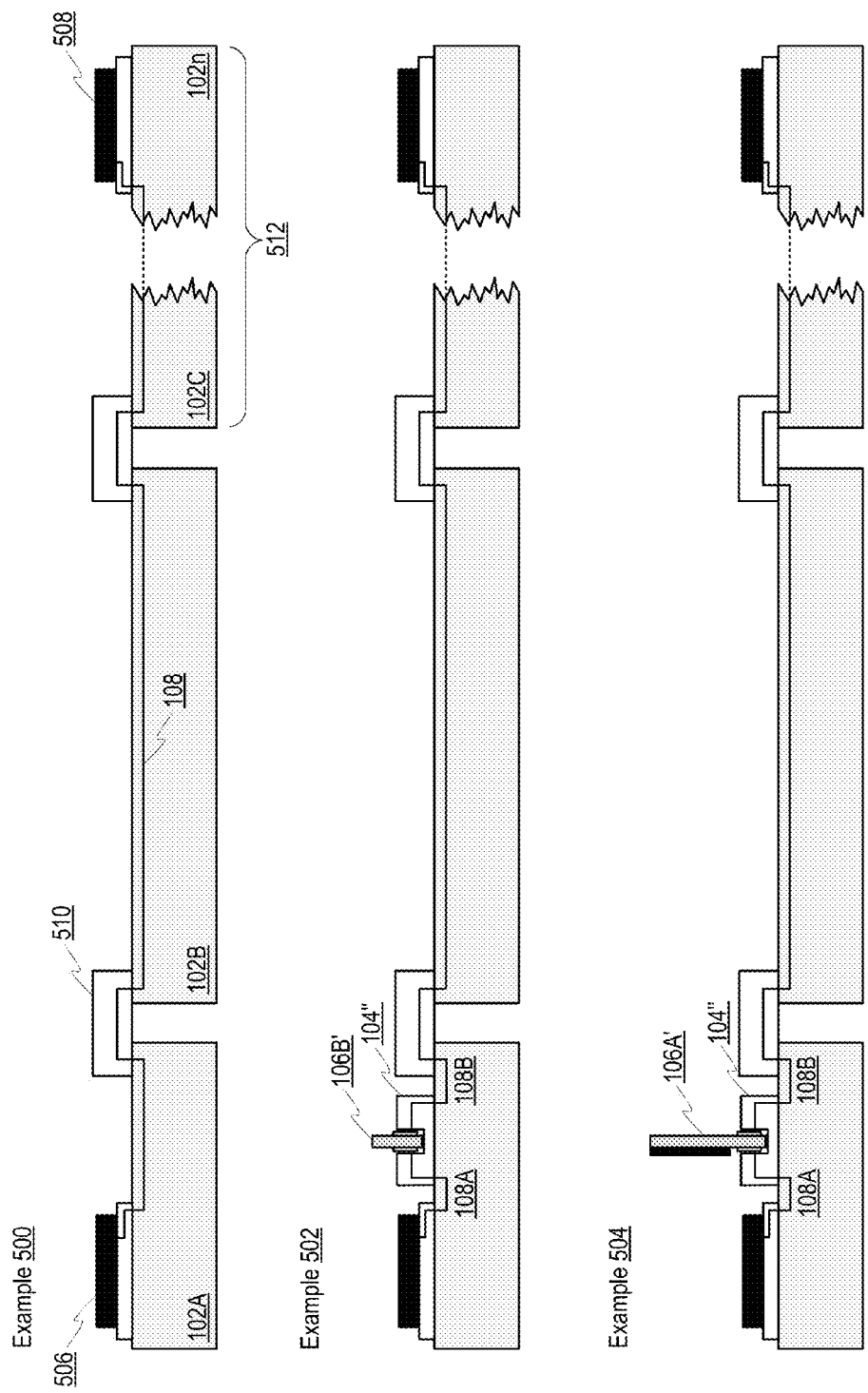

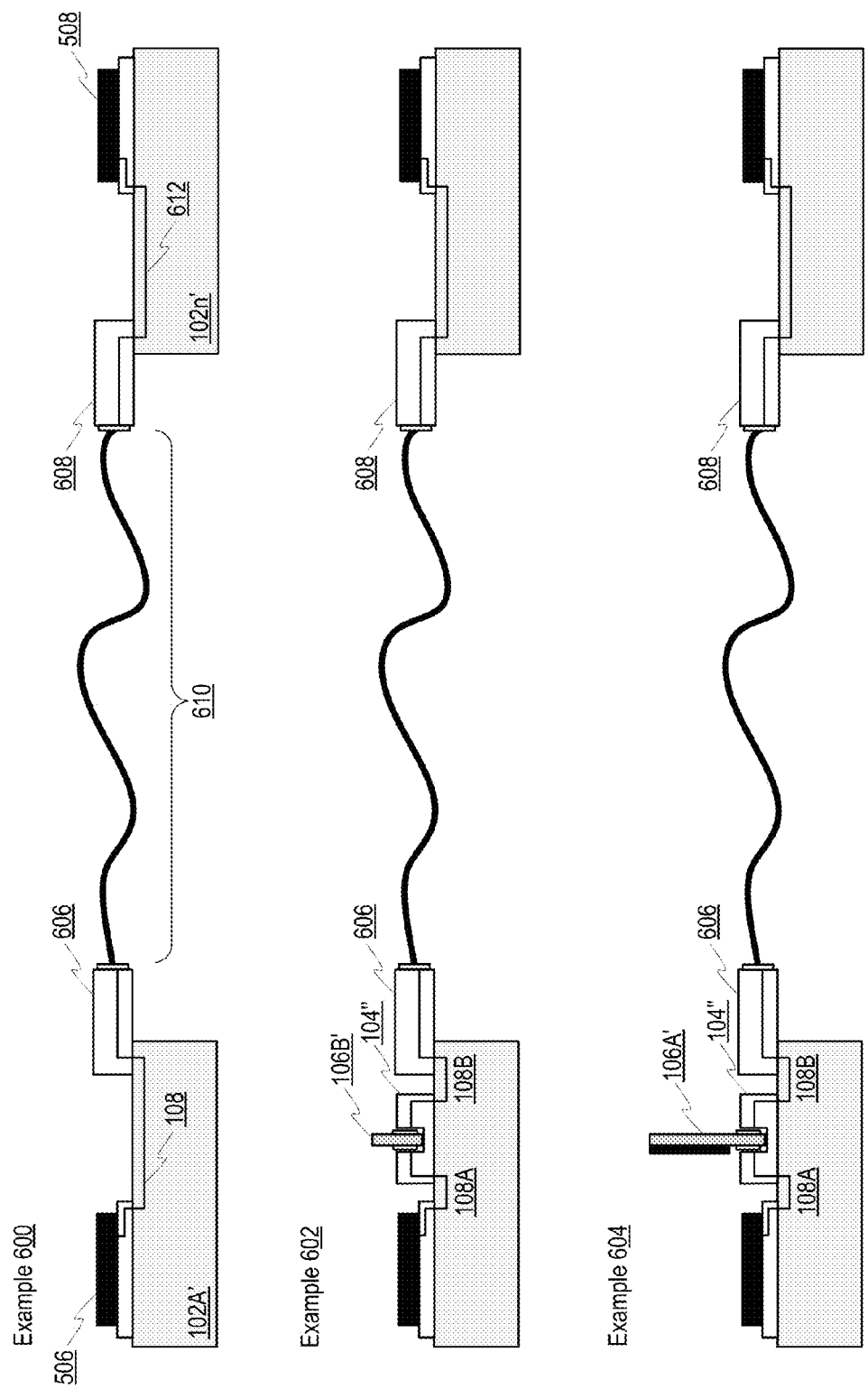

RECONFIGURABLE REPEATER SYSTEM

TECHNICAL FIELD

The present disclosure relates to electronic communications, and more particularly, to a system comprising channels that may be reconfigured to include repeaters to prevent signal loss.

BACKGROUND

In electronic devices equipped with computing functionality, the ability of the device to process data is typically determined based on the capabilities of the processor. This may include, for example, the number of processing cores in the processor, the speed of each processing core, the size and/or speed of the processor memory cache, etc. In general, this method of prediction may be reliable when considering standalone computing devices. However, the data processing performance of an individual system may not be as influential to performance in a larger system that may comprise a large number of computing devices such as, for example, a data center that comprises a plurality of networked data servers, a cloud architecture comprising data processors, servers, etc. (e.g., providing software-as-a-service), high performance computing (HPC) systems, etc. For example, an HPC system may comprise individual computing devices (e.g., nodes) that may be organized into groups (e.g., clusters) to collaboratively process data. A master node in a cluster may break data processing jobs into smaller tasks for processing by compute nodes in the cluster. These operations may substantially parallelize data processing to generate faster results.

While the advantages may be apparent, grouping computing devices together to operate within a larger system may introduce a new set of performance issues. In addition to the ability of each individual computing device, the manner in which the computing devices interact must be considered. While organized in the same logical group, the physical location of devices may be within the same housing (e.g., in the same server case), in a rack separated by other nodes, in different racks, in different rooms, etc. The variability in relative location may present problems when data rates are limited due to loss induced by relatively long channel lengths (e.g., due to a large printed circuit board (PCB), long cable, etc.). When designing computing devices and the equipment employed to interconnect the computing devices in large systems, anticipating what the actual physical organization of the computing devices will be may be difficult given the variety of potential configurations that may be employed when implementing a large system.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 3 illustrates an example implementation of an extender module using an interposer in accordance with at least one embodiment of the present disclosure;

FIG. 4 illustrates an example implementation of an extender module using a riser card in accordance with at least one embodiment of the present disclosure;

FIG. 5 illustrates an example reconfigurable repeater system implemented across a plurality of PCBs in accordance with at least one embodiment of the present disclosure;

FIG. 6 illustrates an example reconfigurable repeater system implemented across PCBs and cables in accordance with at least one embodiment of the present disclosure.

Figure 1:
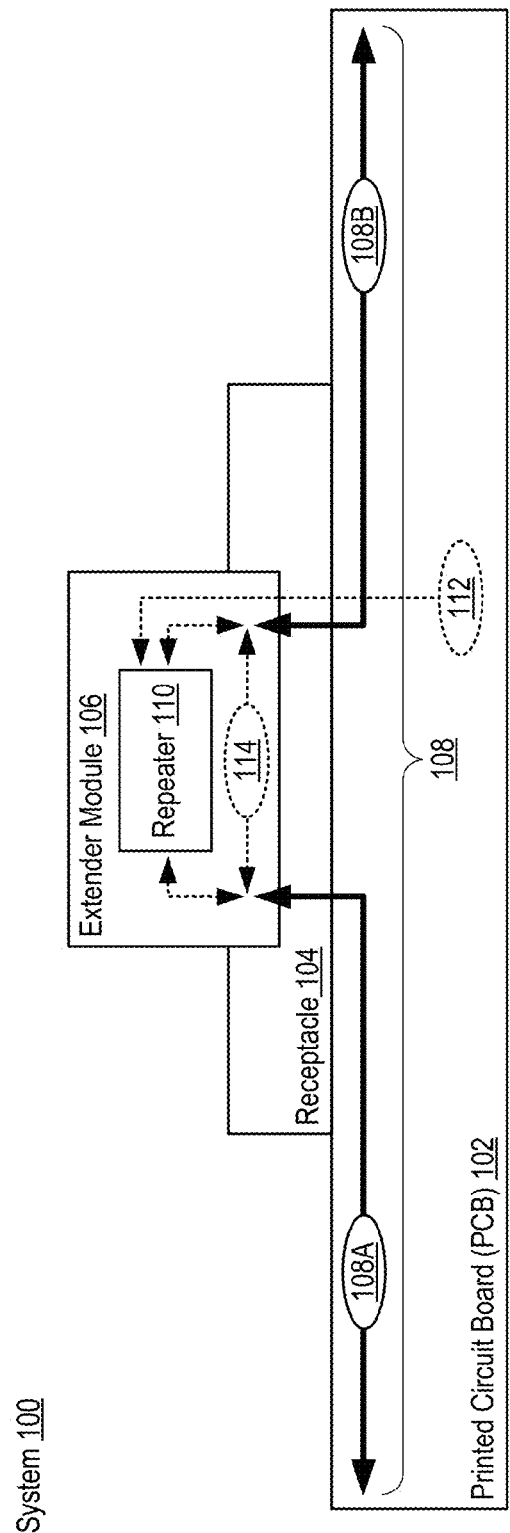
FIG. 1 illustrates an example reconfigurable repeater system in accordance with at least one embodiment of the present disclosure.

Although the following Detailed Description will proceed with reference being made to illustrative embodiments, many alternatives, modifications and variations thereof will be apparent to those skilled in the art.

DETAILED DESCRIPTION

The present disclosure is directed to a reconfigurable repeater system. In at least one embodiment, a system may comprise a PCB to which devices are coupled. At least one communication channel may convey communications signals between the devices. At least one receptacle (e.g., a socket, connector, etc.) may also be coupled to the PCB. The at least one receptacle may intersect the at least one communication channel so as to separate the at least one communication channel into sections. Inserting at least one extender module into the at least one receptacle may couple the at least one extender module to the sections of the communication module. In at least one embodiment, the at least one extender module may include at least one conductor to convey communication signals between the sections of the at least one communication channel. Another configuration of the at least one extender module may include a repeater to receive, amplify and transmit communication signals between the sections of the at least one communication channel. Receptacles may be configured to receive various configurations of extender modules including, for example, extender modules based on interposer assembly or rider card technologies.

In at least one embodiment, a reconfigurable repeater system may comprise, for example, at least one PCB, at least one communication channel, at least one receptacle and at least one extender module. Devices may be coupled to the at least one PCB. The at least one communication channel may be to convey communication signals between the devices, at least part of the at least one communication channel formed in or on the at least one PCB. The at least one receptacle may be coupled to the at least one PCB so as to intersect the at least part of the at least one communication channel formed in or on the at least one PCB, the at least one receptacle causing the at least one communication channel to be separated into sections. The at least one extender module may be inserted into the at least one receptacle, the at least one extender module being coupled to the sections.

In at least one embodiment, the at least one PCB may comprise a plurality of PCBs coupled by at least one physical coupling through which the at least one communication channel is routed. The physical coupling may comprise, for example, at least one cable to convey the communication signals. In at least one example implementation, the at least one receptacle may comprises a connector to receive an interposer assembly including at least the extender module. The at least one receptacle may also comprise a connector to receive a riser card including at least the extender module.

In at least one embodiment, the at least one extender module may comprise at least one conductor to convey the communication signals between the sections. Alternatively, the at least one extender module may comprise a repeater to receive at least one communication signal from a section, amplify the at least one communication signal and transmit the amplified at least one communication signal to another section. Consistent with the present disclosure, an example computing system may comprise at least one node, the at least one node including at least one PCB to which devices are coupled, at least one communication channel to convey communication signals between the devices, at least part of the at least one communication channel formed in or on the at least one PCB, at least one receptacle coupled to the at least one PCB so as to intersect the at least part of the at least one communication channel formed in or on the at least one PCB, the at least one receptacle causing the at least one communication channel to be separated into sections and at least one extender module inserted into the at least one receptacle, the at least one extender module being coupled to the sections. Also consistent with the present disclosure, an example method for configuring a reconfigurable repeater system may comprise determining loss in at least one communication channel conveying communication signals between devices coupled to at least one PCB, determining if the loss exceeds a certain threshold, selecting, based on the certain threshold determination, at least one extender module for insertion into at least one receptacle coupled to the at least one PCB so as to intersect at least part of the at least one communication channel formed in or on the at least one PCB, the at least one receptacle causing the at least one communication channel to be separated into sections and inserting the at least one extender module into the at least one receptacle, the at least one extender module being coupled to the sections.

FIG. 1 illustrates an example reconfigurable repeater system in accordance with at least one embodiment of the present disclosure. While illustrations, descriptions, etc. may be provided herein of example equipment and/or software configurations for performing various operations, embodiments consistent with the present disclosure are not limited only to these demonstrative examples. Equipment may be reconfigured, altered, inserted, omitted, etc., and/or software may be edited, supplemented, deleted, etc. consistent with the embodiments of the present disclosure.

System 100 may comprise, for example, at least one PCB 102, receptacle 104 and extender module 106. Consistent with the present disclosure, examples of PCB 102 may include a backplane, a motherboard, a daughterboard, or any other type of substrate to which electronic circuitry may be mounted. Electronic components, connectors and other equipment may be affixed to PCB 102 to form the hardware making up a computing device. For example, memory, supporting integrated circuits (ICs), interfaces, communication components, etc. may be mounted directly to PCB 102, may be coupled to PCB 102 utilizing connectors, sockets, plugs, etc. PCB 102 may include communication channels 108 (e.g., 108A, 108B, etc.) to, for example, convey communication signals between devices. Communication signals may comprise, for example, analog and/or digital information communicated via electronic transmission including data, instructions, etc. Examples of communication channels 108 linking devices are shown in FIGS. 5-6.

Communication channels 108 may include, for example, conductive vias, traces, pads and other conductive elements etc. formed in or on PCB 102, external wires, etc. In at least one example implementation, other PCBs (not shown) including circuitry for performing specific tasks such as, for example, general data co-processing, video processing, audio processing, volatile or nonvolatile data storage, acting as an interface for wired or wireless data transmission, etc. may be coupled to PCB 102 to supplement the basic functionality provided on PCB 102.

In at least one embodiment, at least one receptacle 104 may be coupled to PCB 102 (e.g., via a surface mount or through-hole connection). Receptacle 104 may intersect channel 108, splitting it into separate sections 108A and 108B each coupled to receptacle 104. Examples of receptacle 104 may comprise a variety of sockets, connectors, plugs, headers, etc. configured to receive individual components, assemblies, modules, etc. Objects plugged into receptacle 104 may be retained and later removed if replacement is desired. At least one purpose for receptacle 104 is to receive and retain extender module 106, and in this regard, to cause extender module 106 to be coupled to at least sections 108A and 108B. Extender module 106 may be configured to convey signals from one section of channel 108 to another (e.g., from section 108A to 108B and vice versa). In one embodiment, extender module 106 may comprise repeater 110. Repeater 110 may be employed where, for example, where a maximum communication speed of channel 108 is limited by the signal loss. For example, characteristics such as channel dimensions (e.g., length, width, etc.), composition, environment (e.g., temperature, electromagnetic, interference, etc.), etc. may be determinative of loss. When it is not possible to improve these characteristics in channel 108 due to, for example, limitations in the configurability of system 100 or in a larger computing architecture of which system 100 is a part, supportive measures such as repeater 110 may be employed to reduce loss and increase communication performance. Repeater 110 may be an active component (e.g., requiring external power to operate) configured to receive signals from a section of channel 108, to amplify the received signal and to transmit the amplified signal on another section (e.g., from section 108A to 108B and vice versa). In at least one embodiment, power 112 may be supplied to extender module 106 from PCB 102 through receptacle 104. The amplification provided by repeater 110 may be accompanied by noise filtering, buffering or a variety of other operations intended to improve communication signal quality, speed, etc.

Alternatively, when repeater 110 is determined to not be required because, for example, it is determined that the loss in channel 108 does not meet and/or exceed a certain threshold where the loss becomes problematic (e.g., where speed is negatively impacted), then extender module 106 may comprise at least one simple conductor 114 to passively convey communication signals between sections 108A and 108B (e.g., without modification to the communication signals). For example, system 100 may include an extender module 106 comprising at least one conductor 114 by default, and upon determination that loss in channel 108 arises to the level (e.g., meets and/or exceeds a certain threshold) wherein amplification is required, extender module 106 comprising at least one conductor 114 may be removed and replaced with extender module 106 comprising at least repeater 110 to amplify the communication level to overcome the loss in channel 108.

It is important to note that while the example disclosed in FIG. 1 discusses receptacle 104 and extender module 106 being applied to only one channel 108, receptacle 104 may intersect a plurality of different channels 108 in PCB 102 so that extender module 106, when inserted into receptacle 104, is coupled to the plurality of channels 108 to provide simple conveyance or amplification functionality. While not illustrated, receptacle 104 may also be configured with an electrical, mechanical or electromechanical assembly causing section 108A to be coupled to section 108B when receptacle 104 is empty (e.g., when no extender module 106 is inserted in receptacle 104). In this manner, when no signal amplification is required (e.g., when repeater 110 is unnecessary) receptacle 104 may remain empty. Moreover, this functionality may provide an additional measure of safety should extender module 106 be inadvertently removed from receptacle 104, or should extender module 106 fall out of, or be knocked out of, receptacle 104.

At least one benefit that may be realized from employing embodiments consistent with the present disclosure is the ability to customize system 100 without substantial redesign. The variety of different configurations required for PCB 102 may be reduced, which simplifies implementation and reduces cost. Cost may also be reduced because repeaters 110 may only be employed when deemed necessary. As a usage situation changes (e.g., architecture contraction or expansion, technological improvements occur, etc.), system modifications may be performed through simply replacing extender modules 106. Moreover, operational overhead may also be reduced since repeaters 110 are not automatically included and active in every PCB 102. For example, the power consumption, heat generation, etc. of individual repeaters 110 may be insubstantial, but when multiplied many times over given the size of a large HPC system, the power consumption and heat generation of these components may become more problematic.

Figure 2:
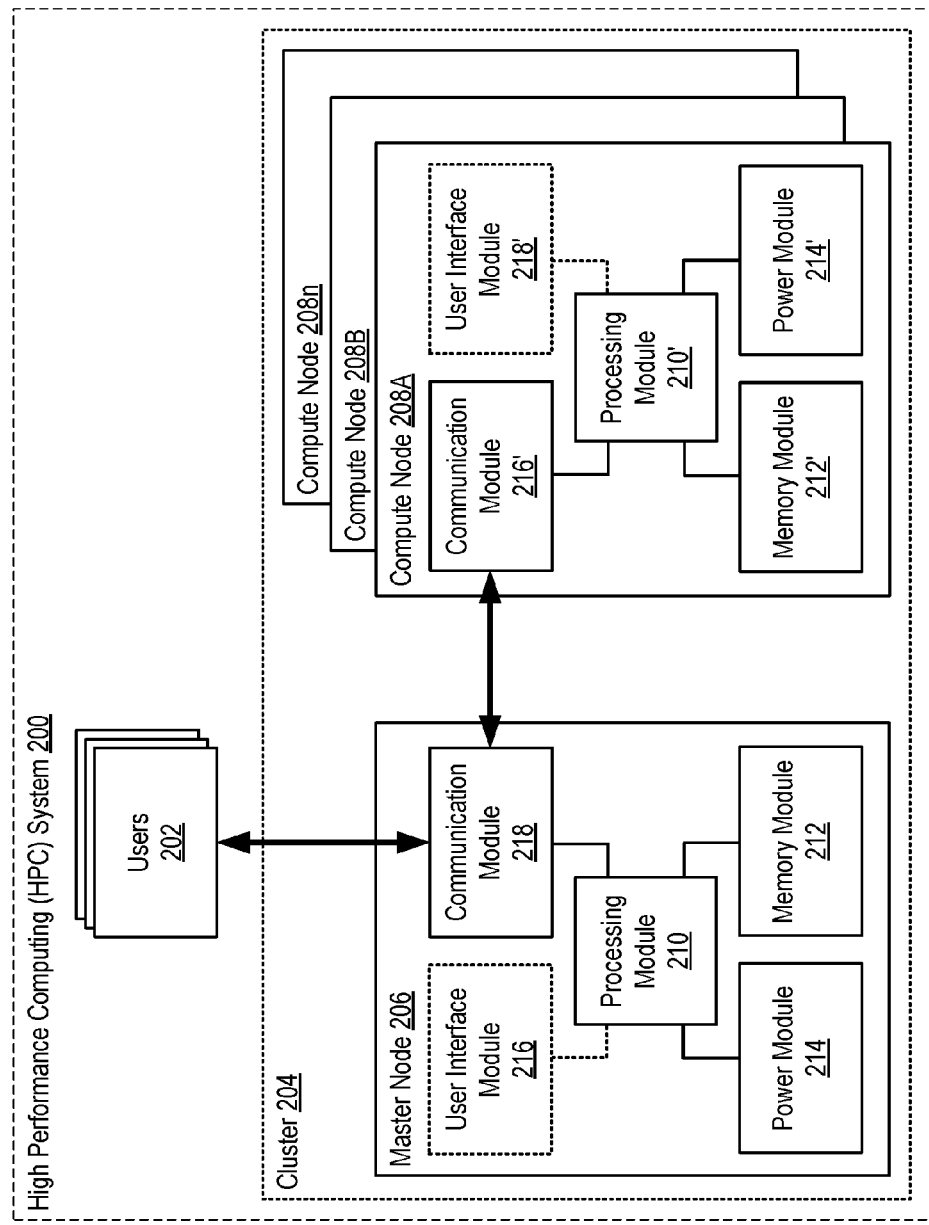
FIG. 2 illustrates an example of HPC system architecture in accordance with at least one embodiment of the present disclosure.

FIG. 2 illustrates an example of HPC system architecture in accordance with at least one embodiment of the present disclosure. While the various embodiments disclosed herein are not limited to implementation in only HPC architectures (e.g., as described above, any large system may benefit from employing the various embodiments), this particular usage provides a readily comprehensible platform for discussing the various embodiments. Moreover, HPC system 200 disclosed in FIG. 2 is intended only as a basic example to express broad concepts related to HPC. In practice, these concepts may be implemented in HPC systems with a variety of configurations.

In general, HPC system 200 may comprise one or more users 202 interacting with at least one cluster 204. While not shown in FIG. 2, there other levels of organization may exist between users 202 and cluster 204, such as an administrator system to coordinate user requests to cluster 204. Cluster may comprise different nodes (e.g., computing devices) to perform different tasks. For example, master node 206 may receive processing jobs for the cluster. Master node 206 may divide the processing job into various tasks and assign the tasks to one or more of compute node 208A, compute node 208B . . . compute node 208n (collectively, "compute nodes 208A . . . n"). In at least one embodiment, compute nodes 208A . . . n may be specialized for certain tasks based on, for example, hardware configuration. For example, compute node 208A may be equipped with a lot of processing power, compute node 208B may have a lot of nonvolatile storage, etc. When the tasks are complete, the results of the tasks may be returned to master node 206, which may proceed to accumulate the results and pass a result of the data processing job back to users 202.

An example configuration for master node 206 and compute nodes 208A . . . n will now be disclosed. Master node 206 may comprise processing module 210, memory module 212, power module 214, user interface module 216 and communications module 218. Processing module 210 may include one or more data processors situated in separate components, or alternatively, one or more processing cores embodied in a single component (e.g., in a System-on-a-Chip (SoC) configuration) and any processor-related support circuitry (e.g., bridging interfaces, etc.). Example processors may include, but are not limited to, various x86-based microprocessors available from the Intel Corporation including those in the Pentium, Xeon, Itanium, Celeron, Atom, Quark, Core i-series, Core M-series product families, Advanced RISC (e.g., Reduced Instruction Set Computing) Machine or "ARM" processors, etc. Examples of support circuitry may include chipsets (e.g., Northbridge, Southbridge, etc. available from the Intel Corporation) configured to provide an interface through which processing module 210 may interact with other system components that may be operating at different speeds, on different buses, etc. in master node 206. Some or all of the functionality commonly associated with the support circuitry may also be included in the same physical package as the processor (e.g., such as in the Sandy Bridge family of processors available from the Intel Corporation).

Processing module 210 may be configured to execute various instructions in master node 206. Instructions may include program code configured to cause processing module 210 to perform activities related to reading data, writing data, processing data, formulating data, converting data, transforming data, etc. Information (e.g., instructions, data, etc.) may be stored in memory module 212. Memory module 212 may comprise random access memory (RAM) or read-only memory (ROM) in a fixed or removable format. RAM may include volatile memory configured to hold information during the operation of master node 206 such as, for example, static RAM (SRAM) or Dynamic RAM (DRAM). ROM may include nonvolatile (NV) memory modules configured based on BIOS, UEFI, etc. to provide instructions when master node 206 is activated, programmable memories such as electronic programmable ROMs (EPROMS), Flash, etc. Other fixed/removable memories may include, but are not limited to, magnetic memories such as, for example, floppy disks, hard disk drives, etc., electronic memories such as solid state flash memory (e.g., an embedded multimedia card (eMMC), a solid state drive (SSD), etc.), removable memory cards or sticks (e.g., micro storage device (uSD), USB, etc.), optical memory such as compact disc-based ROM (CD-ROM), Digital Video Disks (DVD), Blu-Ray Disks, etc.

Power module 214 may include internal power sources (e.g., a battery, fuel cell, etc.) and/or external power sources (e.g., electromechanical or solar generator, power grid, external fuel cell, etc.), and related circuitry configured to supply master node 206 with the power needed to operate. User interface module 216 may include equipment and/or software to allow users to interact with master node 206. Example user interface equipment may include, but is not limited to, various input mechanisms (e.g., microphones, switches, buttons, knobs, keyboards, speakers, touch-sensitive surfaces, at least one sensor configured to capture images and/or sense proximity, distance, motion, gestures, orientation, biometric data, etc.) and various output mechanisms (e.g., speakers, displays, lighted/flashing indicators, electromechanical components for vibration, motion, etc.). The hardware supporting user interface module 216 may be incorporated within master node 206 and/or may be coupled to master node 206 via a wired/wireless communication medium. In at least one embodiment, user interface module 216 may be optional. For example, master node 206 may be a rack mountable server not comprising user interface module 216, but may instead rely upon another device (e.g., a remote access terminal) for user interface features.

Communication module 218 may facilitate inter-device interaction such as, for example, wired and/or wireless communication between users 202, master node 206 and compute nodes 208A . . . n. In some instances, master node 206 may comprise multiple communication modules 218 (e.g., including separate physical interface modules for wired protocols and/or wireless radios). Wired communications may comprise serial and parallel wired mediums such as, for example, Ethernet, USB, Firewire, Thunderbolt, Digital Video Interface (DVI), High-Definition Multimedia Interface (HDMI), etc. Wireless communications may include, for example, close-proximity wireless mediums (e.g., radio frequency (RF) such as based on the RF Identification (RFID) or Near Field Communications (NFC) standards, infrared (IR), etc.), short-range wireless mediums (e.g., Bluetooth, WLAN, Wi-Fi, etc.), long-range wireless mediums (e.g., cellular wide-area radio communication technology, satellite-based communications, etc.), electronic communications via sound waves, etc. In one embodiment, communication module 218 may prevent active wireless communications from interfering with each other. In performing this function, communication module 218 may schedule wireless communication-related activities based on, for example, the relative priority of messages awaiting transmission.

Compute nodes 208A . . . n may comprise modules the same as or similar to master node 206 (e.g., processing module 210', memory module 212', power module 214', user interface module 216' and communications module 218') configured to operate as discussed above. In at least one embodiment, a gating factor for the speed at which cluster 204 can operate may be the maximum speed at which master node 206 and compute nodes 208A . . . n communicate. Factors that may control the rate at which inter-device communications operate may include, but are not limited to, the configuration of the communication channel (e.g., dimensions, composition, etc.), the distance between devices that need to communicate, etc. These factors may dictate the loss that will be experienced in the channel. Consistent with the present disclosure, when the loss is determined to be above a certain threshold (e.g., where the maximum communication speed in the channel is throttled due to a lower than desired speed because of the loss), extender module 106 with repeater 110 may be inserted in receptacle 104 to amplify communication signals and overcome the loss, increasing the maximum speed at which communication can reliably operate.

FIG. 3 illustrates an example implementation of an extender module using an interposer in accordance with at least one embodiment of the present disclosure. Examples 300 and 302 in FIG. 3 describe the use of interposer-based extender module 106A and extender module 106B. As referenced herein, an interposer is an electrical interface assembly to which electronics may be mounted. The use of an interposer is beneficial in that the footprint of the interposer may be maintained even as the electronics on the interposer change. For example, an interposer having the same footprint may be used even as repeater 110' changes. In at least one embodiment, extender module 106A may comprise at least repeater 110' mounted to a surface of an interposer including traces 304A and 304B. Traces 304A and 304B may comprise at least one conductor coupling the pads, pins, etc. of repeater 110 to conductors on a surface of the interposer assembly of extender module 106A that contacts receptacle 104'. When extender module 106A is inserted into receptacle 104', at least traces 304A may couple repeater 110' to section 108A of channel 108, and at least traces 304B may couple repeater 110' to section 108B. Communication signals from section 108A or 108B may then be routed through receptacle 104' and traces 304A or 304B into repeater 110'. The communication signals may be at least amplified and the transmitted out to the other of section 108A or 108B via traces 304A or 304B, respectively, and receptacle 104'.

Should a determination be made that amplification of the communication signals is not needed then extender module 106B may be employed in example 302. The interposer on which extender module 106B is based may comprise at least one conductor 114' configured to couple section 108A to section 108B. This passive coupling may simply convey communication signals between sections 108A and 108B of communication channel 108. There are a variety of benefits that may be realized by using extender module 106B when it is deemed that amplification is not necessary. In addition to the cost savings derived from not dedicating repeater 110' to provide unwarranted amplification in system 100, the power consumption and heat generation associated with repeater 110' may be removed, which when considered on a large scale may be substantial.

FIG. 4 illustrates an example implementation of an extender module using a riser card in accordance with at least one embodiment of the present disclosure. Examples 400 and 402 use riser cards to implement extender modules 106A' and 106B'. Riser cards may comprise circuit assemblies wherein the edge of the PCB itself, or a connector coupled to the edge of the PCB, is configured to interface with receptacle 104". The riser card configuration may be preferable in situations where the available surface area on PCB 102 is tight, the circuitry on the riser card generates substantial heat, and thus, may benefit by better exposure to cooling air in system 100, etc. Riser cards may also be beneficial in that components may be placed on both sides of the riser card (e.g., to accommodate circuitry supporting repeater 110' and/or providing added functionality such as signal filtering, buffering, etc.). Similar to the example of FIG. 3, extender module 106A' may include traces 304A' to couple repeater 110' to section 108A and traces 304B' to couple repeater 110' to section 108B. When inserted into receptacle 104", extender module 106B' may receive communication signals from section 108A or 108B via receptacle 104". The communication signals may be routed to repeater 110' via traces 304A' and 304B', which may amplify the communication signals. The signals amplified by repeater 110' may then be transmitted to the other section 108A or 108B via traces 304A' and 304B', respectively and receptacle 104". Example 402 describes a situation where it is determined that no amplification is required. Extender module 106B' may comprise at least one conductor 114" to couple section 108A to section 108B. The insertion of extender module 106B' into receptacle 104" may allow communication signals to pass between sections 108A and 108B of channel 108.

FIG. 5 illustrates an example reconfigurable repeater system implemented across a plurality of PCBs in accordance with at least one embodiment of the present disclosure. In example 500 a baseline configuration is shown wherein PCB 102 may be made up of a plurality of separate PCBs (e.g., PCB sections or portions as referenced herein) including, for example, PCB portion 102A, PCB portion 102B, PCB portion 102C ... PCB portion 102n (collectively PCB portions 102A ... n) coupled by physical couplings 510. For example, PCB 102 comprising PCB portions 102A ... n may be used in a blade server rack, wherein a plurality of blade servers plug into PCB portions 102 A ... n and communicate with each other over channels 108 in PCB portions 102A ... n. At least devices 506 and 508 may interact through channel 108 in that devices 506 and 508 may at least transmit and receive communication signals through channel 108. As shown at 512, the length of each PCB portion 102A ... n and/or the number of PCB portions 102A ... n may be variable (e.g., based on implementation), which may present a situation wherein the length of channel 108 can become relatively long based on a large number of PCB portions 102A ... n, long lengths of PCB portions 102A ... n, etc. The loss may increase corresponding to the increased length of channel 108, and inversely, the maximum rate at which signals may be reliably transmitted through channel 108 may decrease.

Consistent with the present disclosure, examples 502 and 504 comprise at least receptacle 104" intersecting channel 108 to form sections 108A and 108B. In at least one embodiment, it may be possible for more than one receptacle 104" to intersection a channel 108 for very long channel runs. In example 502 extender module 106B' is inserted into receptacle 104" to convey communication signals between sections 108A and 108B (e.g., through at least one conductor 114"). Should signal amplification be needed (e.g., for channels 108 experiencing unacceptable signal loss), extender module 106B' may be removed and replaced with extender module 106A' including repeater 110'. Repeater 110' may receive power from PCB portions 102A ... n through receptacle 104" (e.g., as shown in FIG. 1). In this manner, communication signals that are being conveyed in a channel experiencing unacceptable loss may be amplified, allowing the signals to be transmitted at a faster rate and overall performance in system 100 to improve.

FIG. 6 illustrates an example reconfigurable repeater system implemented across PCBs and cables in accordance with at least one embodiment of the present disclosure. In example 600 a baseline configuration is shown wherein at least PCB portions 102A' and 102n' may be coupled by cable 610. For example, cable 610 may be coupled to PCB portions 102A' and 102n' via connectors 606 and 608. Devices 506 and 508 may interact via the combination of channel 108, cable 610 and channel 612. The length of cable 610 may be variable based on, for example, an implementation of a large system such as an HPC system, an environment in which the HPC system is installed, etc. The baseline configuration disclosed in example 600 is limited in that it is not reconfigurable to accommodate extended lengths of cable 610. If the length of cable 610 cannot be limited, then the speed of communication between devices 506 and 508 may be limited to account for loss.

Consistent with the present disclosure, examples 602 and 604 introduce receptacle 104" intersecting channel 108 to form sections 108A and 108B. In example 602, extender module 106B' is inserted into receptacle 104" to provide simple bridging functionality without any amplification. In example 604, extender module 106B' is replaced with extender module 106A' including repeater 110'. For configurations where cable 610 is lossier due to, for example, longer length, extender module 106A' may improve signal quality and overall performance.

While FIGS. 5 and 6 show examples of repeater modules 106A' and 106B' in a riser card configuration, these examples may also be implemented using an interposer configuration such as disclosed in FIG. 3. Moreover, while receptacle 104" has been shown as intersecting channel 108 on PCB portion 102A in FIGS. 5 and 6, the placement of receptacle 104" is variable. For example, receptacle 104" may also intersect channel 108 on PCB section 102B, 102C ... 102n. The placement of receptacle 104" may depend on, for example, typical amplification needs for devices 506 and 508, board space, the availability of power 112 in a particular PCB section to supply repeater 110', etc.

Different behaviors have been observed from practical application and testing consistent with various embodiments of the present disclosure. Initially, testing has considered situations extending channel 108 through lengths of PCB 102 between 16 and 24 inches, as well as various lengths of cable up to 120 inches. Utilizing examples 600, 602 and 604 in FIG. 6 as a basis for explanation, the difference in performance is negligible between the baseline scenario such as shown example 600 and example 602 wherein extender module 106B' including at least one conductor 114' is employed. On the contrary, the use of extender module 106A' including repeater 110' in example 604 demonstrates significant improvement in performance (e.g., data rate) for device 506 coupled to section 108A (e.g., the device closest to extender module 106A') and lesser but still substantially improved performance for device 508 coupled to through section 108B, cable 610 and channel 612.

Figure 7:
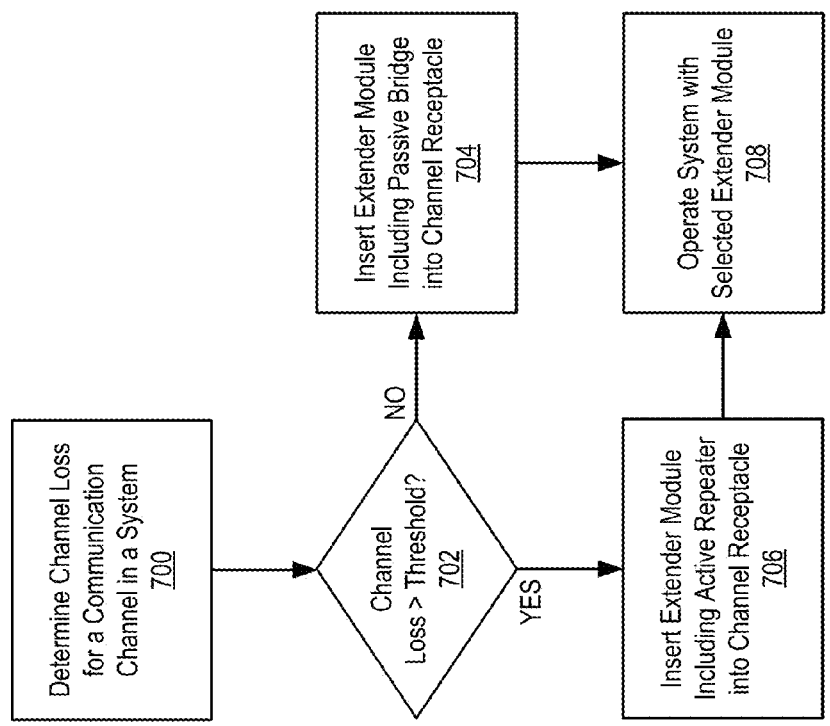
FIG. 7 illustrates example operations related to a reconfigurable repeater system in accordance with at least one embodiment of the present disclosure.

FIG. 7 illustrates example operations related to a reconfigurable repeater system in accordance with at least one embodiment of the present disclosure. The example operations illustrated in FIG. 7 may be performed by, for example, an automated assembly line configured to manufacture, assemble or at least configure system 100 (e.g., for at least one node). Channel loss may be determined for a communication channel is a system in operation 700. Channel loss may be determined based on, for example, the dimensions of the communication channel, composition of the communication channel, environment in which the communication channel is operating, etc. A determination may then be made in operation 702 as to whether the loss determined in operation 700 is greater than a certain threshold. The certain threshold may be based on, for example, how loss impacts overall communication speed (e.g., data rate) in the channel. If in operation 702 it is determined that the loss is not greater than the certain threshold, then an extender module including a passive bridge (e.g., at least one conductor) may be inserted into a receptacle intersecting the channel in operation 704. If in operation 702 the loss is determined to be above the certain threshold, then in operation 706 an extender module including an active repeater may be inserted into the receptacle.

Following either of operations 704 or 706, in operation 708 the system may be operated with the selected extender module. For example, if the extender module including a passive bridge was selected in operation 704, then communication signals may simply be conveyed from one section of conductor to another. Alternatively, if an extender module including an active repeater was selected in operation 706, then during operation communication signals may be received from a channel section, amplified and then transmitted on another channel section.

While FIG. 7 illustrates operations according to an embodiment, it is to be understood that not all of the operations depicted in FIG. 7 are necessary for other embodiments. Indeed, it is fully contemplated herein that in other embodiments of the present disclosure, the operations depicted in FIG. 7, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the term "module" may refer to software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The modules may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more storage mediums (e.g., non-transitory storage mediums) having stored thereon, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software modules executed by a programmable control device.

Thus, the present disclosure is directed to a reconfigurable repeater system. A system may comprise a PCB to which devices are coupled. At least one communication channel may convey communications signals between the devices. At least one receptacle may also be coupled to the PCB and may intersect the at least one communication channel so as to separate the at least one communication channel into sections. Inserting at least one extender module into the at least one receptacle may couple the at least one extender module to the sections of the communication module. The at least one extender module may include at least one conductor to convey communication signals between the sections of the at least one communication channel. Another configuration of the at least one extender module may include a repeater to receive, amplify and transmit communication signals between the sections of the at least one communication channel.

The following examples pertain to further embodiments. The following examples of the present disclosure may comprise subject material such as a device, a method, at least one machine-readable medium for storing instructions that when executed cause a machine to perform acts based on the method, means for performing acts based on the method and/or a reconfigurable repeater system, as provided below.

According to example 1 there is provided a reconfigurable repeater system. The system may comprise at least one printed circuit board to which devices are coupled, at least one communication channel to convey communication signals between the devices, at least part of the at least one communication channel formed in or on the at least one printed circuit board, at least one receptacle coupled to the at least one printed circuit board so as to intersect the at least part of the at least one communication channel formed in or on the at least one printed circuit board, the at least one receptacle causing the at least one communication channel to be separated into sections and at least one extender module inserted into the at least one receptacle, the at least one extender module being coupled to the sections.

Example 2 may include the elements of example 1, wherein the at least one printed circuit board comprises a plurality of printed circuit boards coupled by at least one physical coupling through which the at least one communication channel is routed.

Example 3 may include the elements of example 2, wherein the physical coupling comprises at least one cable to convey the communication signals.

Example 4 may include the elements of any of examples 1 to 3, wherein the at least one receptacle comprises a connector to receive an interposer assembly including at least the extender module.

Example 5 may include the elements of any of examples 1 to 4, wherein the at least one receptacle comprises a connector to receive a riser card including at least the extender module.

Example 6 may include the elements of any of examples 1 to 5, wherein the at least one receptacle comprises an assembly to couple the sections of the at least one communication channel together when no extender module is inserted into the receptacle.

Example 7 may include the elements of any of examples 1 to 6, wherein the extender module is removable from the at least one receptacle.

Example 8 may include the elements of any of examples 1 to 7, wherein the extender module further comprises at least one trace to electrically couple the extender module to the at least one receptacle.

Example 9 may include the elements of any of examples 1 to 8, wherein the at least one extender module comprises at least one conductor to convey the communication signals between the sections.

Example 10 may include the elements of any of examples 1 to 9, wherein the at least one extender module comprises a repeater to receive at least one communication signal from a section, amplify the at least one communication signal and transmit the amplified at least one communication signal to another section.

Example 11 may include the elements of example 10, wherein the at least one printed circuit board is further to provide power for operating the repeater to the at least one extender module via the at least one receptacle.

According to example 12 there is provided a computing system. The computing system may comprise at least one node, the at least one node including at least one printed circuit board to which devices are coupled, at least one communication channel to convey communication signals between the devices, at least part of the at least one communication channel formed in or on the at least one printed circuit board, at least one receptacle coupled to the at least one printed circuit board so as to intersect the at least part of the at least one communication channel formed in or on the at least one printed circuit board, the at least one receptacle causing the at least one communication channel to be separated into sections and at least one extender module inserted into the at least one receptacle, the at least one extender module being coupled to the sections.

Example 13 may include the elements of example 12, wherein the at least one printed circuit board comprises a plurality of printed circuit boards coupled by at least one physical coupling through which the at least one communication channel is routed.

Example 14 may include the elements of example 13, wherein the physical coupling comprises at least one cable to convey the communication signals.

Example 15 may include the elements of any of examples 1 to 14, wherein the at least one receptacle comprises a connector to receive an interposer assembly including at least the extender module.

Example 16 may include the elements of any of examples 1 to 15, wherein the at least one receptacle comprises a connector to receive a riser card including at least the extender module.

Example 17 may include the elements of any of examples 1 to 16, wherein the at least one receptacle comprises an assembly to couple the sections together when no extender module is inserted into the receptacle.

Example 18 may include the elements of any of examples 1 to 17, wherein the extender module is removable from the at least one receptacle for replacement with another extender module.

Example 19 may include the elements of any of examples 1 to 18, wherein the extender module further comprises at least traces to electrically couple the extender module to the at least one receptacle.

Example 20 may include the elements of any of examples 1 to 19, wherein the at least one extender module comprises at least one conductor to convey the communication signals between the sections.

Example 21 may include the elements of any of examples 1 to 20, wherein the at least one extender module comprises a repeater to receive at least one communication signal from a section, amplify the at least one communication signal and transmit the amplified at least one communication signal to another section.

Example 22 may include the elements of example 21, wherein the at least one printed circuit board is further to provide power for operating the repeater to the at least one extender module via the at least one receptacle.

According to example 23 there is provided a method for configuring a reconfigurable repeater system. The method may comprise determining loss in at least one communication channel conveying communication signals between devices coupled to at least one printed circuit board, determining if the loss exceeds a certain threshold, selecting, based on the certain threshold determination, at least one extender module for insertion into at least one receptacle coupled to the at least one printed circuit board so as to intersect at least part of the at least one communication channel formed in or on the at least one printed circuit board, the at least one receptacle causing the at least one communication channel to be separated into sections and inserting the at least one extender module into the at least one receptacle, the at least one extender module being coupled to the sections.

Example 24 may include the elements of example 23, wherein selecting at least one extender module comprises selecting an extender module including a passive conductor if the loss is determined to be at or below the certain threshold.

Example 25 may include the elements of any of examples 23 to 24, wherein selecting at least one extender module comprises selecting an extender module including a repeater if the loss is determined to be at or above the certain threshold.

Example 26 may include the elements of any of examples 23 to 25, and may further comprise receiving the at least one communication signal from a section, amplifying the received communication signal and transmitting the amplified at least one communication signal to another section.

According to example 27 there is provided a system including at least a printed circuit board, a receptacle and an extender module, the system being arranged to perform the method of any of the above examples 23 to 26.

According to example 28 there is provided a chipset arranged to perform the method of any of the above examples 23 to 26.

According to example 29 there is provided at least one machine readable medium comprising a plurality of instructions that, in response to be being executed on a computing device, cause the computing device to carry out the method according to any of the above examples 23 to 26.

According to example 30 there is provided at least one device comprising a reconfigurable repeater system, the at least one device being arranged to perform the method of any of the above examples 23 to 26.

According to example 31 there is provided a system for configuring a reconfigurable repeater system. The system may comprise means for determining loss in at least one communication channel conveying communication signals between devices coupled to at least one printed circuit board, means for determining if the loss exceeds a certain threshold, means for selecting, based on the certain threshold determination, at least one extender module for insertion into at least one receptacle coupled to the at least one printed circuit board so as to intersect at least part of the at least one communication channel formed in or on the at least one printed circuit board, the at least one receptacle causing the at least one communication channel to be separated into sections and means for inserting the at least one extender module into the at least one receptacle, the at least one extender module being coupled to the sections.

Example 32 may include the elements of example 31, wherein the means for selecting at least one extender module comprise means for selecting an extender module including a passive conductor if the loss is determined to be at or below the certain threshold.

Example 33 may include the elements of any of examples 31 to 32, wherein the means for selecting at least one extender module comprise means for selecting an extender module including a repeater if the loss is determined to be at or above the certain threshold.

Example 34 may include the elements of any of examples 31 to 33, and may further comprise means for receiving the at least one communication signal from a section, means for amplifying the received communication signal and means for transmitting the amplified at least one communication signal to another section.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A reconfigurable repeater system, comprising:
   at least one printed circuit board to which devices are coupled;
   at least one communication channel to convey communication signals between the devices, at least part of the at least one communication channel formed in or on the at least one printed circuit board; and
      at least one receptacle coupled to the at least one printed circuit board so as to intersect the at least part of the at least one communication channel formed in or on the at least one printed circuit board, the at least one receptacle causing the at least one communication channel to be separated into a first communication channel section and a second communication channel section, the first communication channel section being electrically isolated from the second communication channel section;
      wherein the at least one receptacle accepts the insertion of only an extender circuit consisting of either:
         an electrically conductive jumper that communicably couples the first communication channel section to the second communication channel section; or
         a repeater circuit to receive an input signal from the first communication channel section and transmit an output signal to the second communication channel section.

2. The system of claim 1, wherein the at least one printed circuit board comprises a plurality of printed circuit boards coupled by at least one physical coupling through which the at least one communication channel is routed.

3. The system of claim 2, wherein the physical coupling comprises at least one cable to convey the communication signals.

4. The system of claim 1, wherein the at least one receptacle comprises a connector to receive an interposer assembly including the extender circuit.

5. The system of claim 1, wherein the at least one receptacle comprises a connector to receive a riser card including the extender circuit.

6. A computing system, comprising:
   at least one node, the at least one node including:
      at least one printed circuit board to which devices are coupled;
      at least one communication channel to convey communication signals between the devices, at least part of the at least one communication channel formed in or on the at least one printed circuit board; and
      at least one receptacle coupled to the at least one printed circuit board so as to intersect the at least part of the at least one communication channel formed in or on the at least one printed circuit board, the at least one receptacle causing the at least one communication channel to be separated into a first communication channel section and a second communication channel section, the first communication channel section being electrically isolated from the second communication channel section;
      wherein the at least one receptacle accepts the insertion of only an extender circuit consisting of either:
         an electrically conductive jumper to communicably couple the first communication channel section to the second communication channel section; or
         a repeater circuit to receive an input signal from the first communication channel section and transmit an output signal to the second communication channel section.

7. The system of claim 6, wherein the at least one receptacle comprises a connector to receive an interposer assembly including the extender circuit.

8. The system of claim 6, wherein the at least one receptacle comprises a connector to receive a riser card including the extender circuit.

9. A method for configuring a reconfigurable repeater system, comprising:
   determining loss in at least one communication channel conveying communication signals between devices coupled to at least one printed circuit board;
   determining if the loss exceeds a certain threshold; and
   selecting, based on the certain threshold determination, at least one extender circuit for insertion into at least one receptacle coupled to the at least one printed circuit board so as to intersect at least part of the at least one communication channel formed in or on the at least one printed circuit board, the at least one receptacle causing the at least one communication channel to be separated into a first communication channel section and a second communication channel section, the first communication channel section being electrically isolated from the second communication channel section;
   wherein the at least one receptacle accepts the insertion of only an extender circuit of the at least one extender circuit consisting of either:
      an electrically conductive jumper to communicably couple the first communication channel section to the second communication channel section; or
      a repeater circuit to receive an input signal from the first communication channel section and transmit an output signal to the second communication channel section.

10. At least one non-transitory machine-readable storage medium having stored thereon, individually or in combination, instructions for configuring a reconfigurable repeater system that, when executed by one or more processors, cause the one or more processors to:
   determine loss in at least one communication channel conveying communication signals between devices coupled to at least one printed circuit board;
   determine if the loss exceeds a certain threshold; and
   select, based on the certain threshold determination, at least one extender circuit for insertion into at least one receptacle coupled to the at least one printed circuit board so as to intersect at least part of the at least one communication channel formed in or on the at least one printed circuit board, the at least one receptacle causing the at least one communication channel to be separated into a first communication channel section and a second communication channel section, the first communication channel section being electrically isolated from the second communication channel section;

wherein the at least one receptacle accepts the insertion of only an extender circuit of the at least one extender circuit consisting of either:

an electrically conductive jumper to communicably couple the first communication channel section to the second communication channel section; or a repeater circuit to receive an input signal from the first communication channel section and transmit an output signal to the second communication channel section.

11. The system of claim 1 wherein said repeater circuit improves signal quality of the at least one communication signal using a buffering circuit.

12. The system of claim 6 wherein said repeater circuit improves signal quality of the at least one communication signal using a buffering circuit.

13. The method of claim 9 wherein said repeater circuit improves signal quality of the at least one communication signal using a buffering circuit.

14. The computer readable storage medium of claim 10 wherein said repeater circuit improves signal quality of the at least one communication signal using a buffering circuit.

15. The system of claim 1 wherein the repeater circuit includes at least one of:

amplifier circuitry to increase an energy level of the input signal received from the first communication channel section and transmit the output signal having a higher energy level than the input signal to the second communication channel section; and noise filtering circuitry to decrease a noise level of the input signal received from the first communication channel section and transmit the output signal having a noise level less than the input signal to the second communication channel section.

* * * * *